(12) United States Patent
Dinc et al.

(10) Patent No.: US 9,397,682 B2
(45) Date of Patent: Jul. 19, 2016

(54) REFERENCE BUFFER WITH WIDE TRIM RANGE

(71) Applicant: ANALOG DEVICES, INC., Norwood, MA (US)

(72) Inventors: Huseyin Dinc, Greensboro, NC (US); Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/262,274

(22) Filed: Apr. 25, 2014

(65) Prior Publication Data

US 2015/0309526 A1    Oct. 29, 2015

(51) Int. Cl.
| | |
|---|---|
| *H03K 19/0175* | (2006.01) |
| *H03K 19/094* | (2006.01) |
| *H03M 1/12* | (2006.01) |
| *H03M 1/16* | (2006.01) |
| *H03F 3/50* | (2006.01) |
| *H03K 19/0185* | (2006.01) |
| *H03M 1/14* | (2006.01) |
| *H03M 1/38* | (2006.01) |

(52) U.S. Cl.
CPC .................. *H03M 1/12* (2013.01); *H03F 3/505* (2013.01); *H03K 19/018585* (2013.01); *H03M 1/164* (2013.01); *H03M 1/167* (2013.01); *H03M 1/145* (2013.01); *H03M 1/38* (2013.01)

(58) Field of Classification Search
CPC ................ H03K 19/00315; H03K 19/018521; H03K 19/0013; H03K 19/00384; H03K 19/018585; H03K 19/0175; H03K 19/017509; H03K 19/017518; H03K 19/017554; H03K 19/01806; H03K 19/018507; H03K 19/082; H03K 19/09418; H03K 19/09448; H03K 19/212; H03K 2005/00163; H03K 5/2436; H03K 17/145; H03F 2203/5036; H03F 3/265; H03F 3/505; H03M 1/1061; H03M 1/765

See application file for complete search history.

(56) References Cited

U.S. PATENT DOCUMENTS

| | | | | |
|---|---|---|---|---|
| 6,163,191 | A | * | 12/2000 | Miyagi .......................... 327/208 |
| 6,259,322 | B1 | * | 7/2001 | Muza .............................. 330/257 |
| 7,327,166 | B2 | | 2/2008 | Zanchi et al. |

(Continued)

OTHER PUBLICATIONS

Extended European Search Report issued in EP Application No. 15163434.2 mailed Oct. 1, 2015, 10 pages.

(Continued)

*Primary Examiner* — Vibol Tan
(74) *Attorney, Agent, or Firm* — Patent Capital Group

(57) ABSTRACT

Circuits for generating voltage references are common in electronics. For example, these circuits are used in analog-to-digital converters, which convert an analog signal into its digital representation by comparing analog input signals against one or more voltage references provided by those circuits. In many applications, the speed and accuracy of such voltage references are very important. The speed of the voltage references is related to the physical properties of the devices in the circuit. The accuracy of the voltage reference is directly related to the circuit's ability to trim the full-scale voltage output. The present disclosure describes a fast and efficient reference buffer with a wide trim range which is particular suitable for submicron processes and high speed applications. The reference buffer comprises a plurality of diode-connected transistors, which can be selected to turn on or off using a controller to provide a wide trim range.

20 Claims, 9 Drawing Sheets

(56) References Cited

U.S. PATENT DOCUMENTS

| | | | |
|---|---|---|---|
| 7,652,601 B2 | 1/2010 | Patterson et al. | |
| 7,667,529 B2 * | 2/2010 | Consuelo | G11C 5/145 327/156 |
| 7,821,296 B2 | 10/2010 | Singer et al. | |
| 2006/0109156 A1 * | 5/2006 | Colbeck et al. | 341/154 |
| 2006/0202876 A1 * | 9/2006 | Lee | 341/126 |
| 2006/0208933 A1 | 9/2006 | Chen | |
| 2007/0287404 A1 * | 12/2007 | Arnborg | 455/333 |
| 2008/0030233 A1 | 2/2008 | Singer et al. | |
| 2009/0079471 A1 | 3/2009 | Cheng | |
| 2010/0327919 A1 * | 12/2010 | Oka | 327/109 |
| 2011/0248688 A1 * | 10/2011 | Iacob et al. | 323/234 |

OTHER PUBLICATIONS

"Threshold Voltage", Dependence on Random Dopant Fluctuation, retrieved from the Internet: https://en.wikipedia.org/w/index.php?title=Special:Book&bookcmd=download&collection_id=4abad769843723c5d5fa5c5dff440fbfa8e0a567&writer=rdf2latex&return_to=Threshold voltage, Dec. 9, 2013 4 pages.

* cited by examiner

US 9,397,682 B2

REFERENCE BUFFER WITH WIDE TRIM RANGE

TECHNICAL FIELD OF THE DISCLOSURE

The present disclosure relates generally to electronics and, more particularly, to reference buffers with a wide trim range.

BACKGROUND

Electronics often include components which converts analog signals to digital signals. Once the analog signals are converted into digital signals, computer processors can process the digital signals efficiently to provide a variety of valuable functions. These components are referred to generally as converters, and more specifically, analog-to-digital converters (ADCs). ADCs are used in a myriad of applications, such as telecommunications, automotive technology, medical devices, audio technology, video technology, etc. Depending on the application, different types of ADCs are used. The designs for the ADCs can vary drastically, and the need to improve these ADCs continue to rise as the requirements for these ADCs rise as well.

BRIEF SUMMARY OF THE DISCLOSURE

Circuits for generating voltage references are common in electronics. For example, these circuits are used in analog-to-digital converters, which convert an analog signal into its digital representation by comparing analog input signals against one or more voltage references provided by those circuits. In many applications, the speed and accuracy of such voltage references are very important. The speed of the voltage references is related to the physical properties of the devices in the circuit. The accuracy of the voltage reference is directly related to the circuit's ability to trim the full-scale voltage output. The present disclosure describes a fast and efficient reference buffer with a wide trim range which is particular suitable for submicron processes and high speed applications. The reference buffer comprises a plurality of diode-connected transistors, which can be selected to turn on or off using a controller to provide a wide trim range.

DESCRIPTION OF EXAMPLE EMBODIMENTS OF THE DISCLOSURE

Understanding Pipeline ADCs and Importance of Reference Buffers

For demanding applications where the speed of conversion is crucial, a particular type of analog-to-digital converter (ADC) is often used—pipeline ADCs. Pipeline ADCs are capable of achieving impressive resolution and signal-to-noise ratio performance at extremely high sample rates. The speed of a pipeline ADC is realized by processing an analog input signal through a series of pipelined converter stages. Each stage outputs a part of the digital output signal (i.e., a respective part of a digital code), and each stage (except for the last stage) compares an analog signal or a residual of the analog signal against a reference voltage to generate the respective part of the digital output signal.

Because of this architecture, the accuracy of the ADC is directly dependent on the accuracy of the residual signal, which is in turn directly dependent on the parameters of the reference voltages in these pipelined stages. The parameters of the reference voltages may include speed, accuracy, and impedance. With regards to speed, the reference voltage ought to be generated quickly enough to support the speed at which the ADC should operate. With regards to accuracy, the reference voltage ought to be trimmed to provide a stable reference voltage. With regards to impedance, the reference voltage buffer should have low impedance, which in turn enhances the speed and accuracy of the reference voltage.

Designing Reference Buffers is not Trivial

Figure 1:
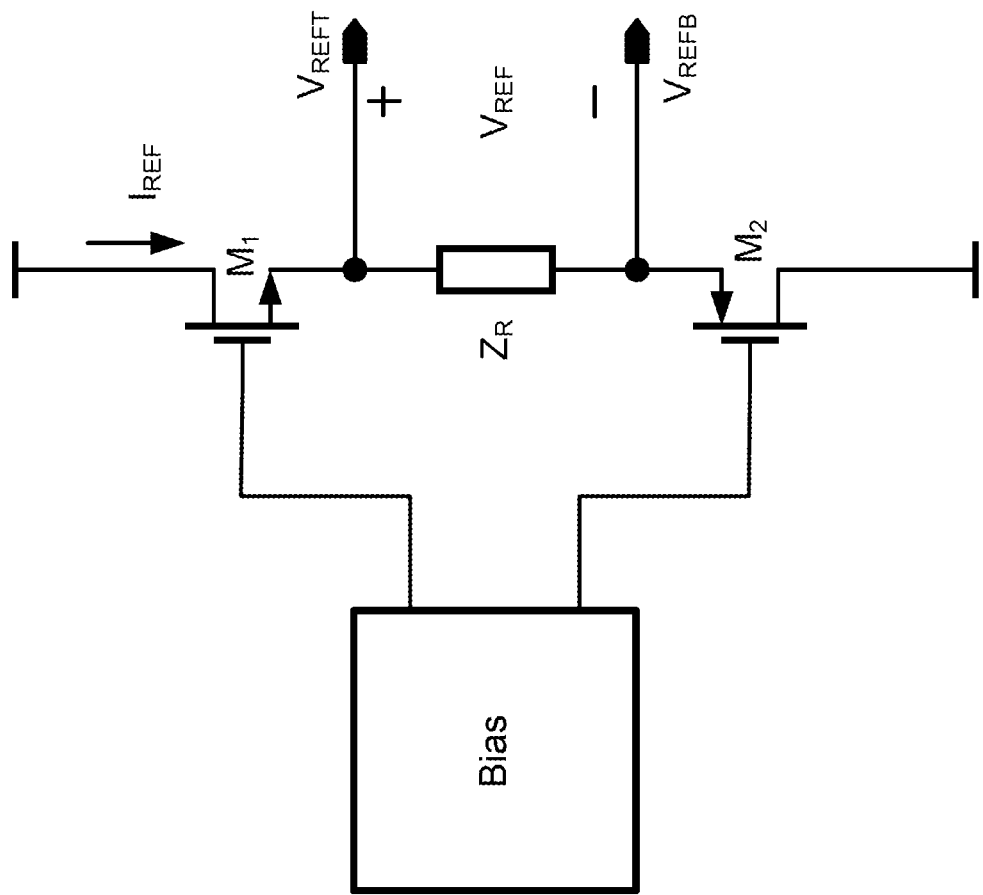
FIG. 1 is a schematic modeling a reference buffer, according to some embodiments of the disclosure.

Designing a fast, accurate, and efficient reference buffer for providing a reference voltage is not a trivial task. FIG. 1 is a schematic modeling a reference buffer, according to some embodiments of the disclosure. High speed internal reference buffers used in high speed ADCs typically use a stacked (e.g., class AB) n-channel metal-oxide semiconductor field-effect (NMOS) transistor (shown in FIG. 1 as $M_1$) plus p-channel metal-oxide semiconductor field-effect (PMOS) transistor (shown in FIG. 1 as $M_2$) source follower as a low impedance voltage buffer. The transistors are in a common drain configuration. Moreover, the NMOS transistor and the PMOS transistor are separated by a pass device (shown as $Z_R$). The model shown in FIG. 1 can be seen as having a push-pull topology.

The complementary common-drain output stage, i.e., the stacked NMOS-PMOS source follower, and the pass device provide a reference buffer which can be used to generate a reference voltage $V_{REF}$, for instance, in a pipeline ADC, successive approximation register (SAR) ADC, or any ADC which uses one or more reference voltages to convert signals. Specifically, the voltages about the pass device, i.e., at the terminals of the pass device, provides the reference voltage $V_{REF}$, which is taken between reference voltage signals: top reference voltage $V_{REFT}$ and bottom reference voltage $V_{REFB}$.

It is noted that the accuracy of the top reference voltage $V_{REFT}$ and the bottom reference voltage $V_{REFB}$ affects the quality of the residual signal being generated in the various pipelined stages in the pipeline ADC. For this reason, the design of the pass device is crucial to the pass device's ability to control the top reference voltage $V_{REFT}$ and the bottom reference voltage $V_{REFB}$.

Various Ways to Implement the Pass Device and their Limitations

There are various ways the pass device $Z_R$ (as presented in the model shown in FIG. 1) can be implemented. Generally speaking, the pass device $Z_R$ ought to exhibit bidirectional low impedance for fast differential settling.

Figure 2:
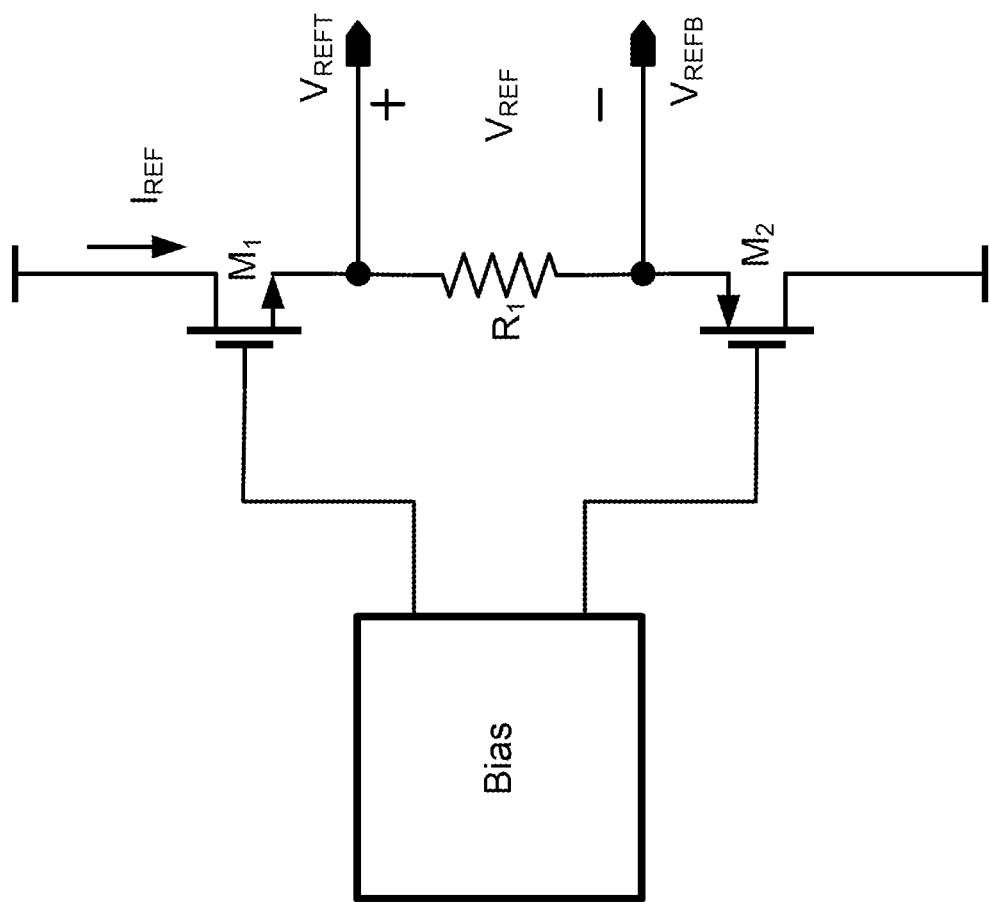
FIG. 2 is a schematic illustrating an implementation of a reference buffer using a resistor.

In one example, the pass device can be implemented by a resistor. FIG. 2 is a schematic illustrating an implementation of a reference buffer using a resistor (shown as $R_1$ in the FIGURE). Using a resistor $R_1$ to implement the pass device requires a very large current ($I_{REF}$), and burning a large amount current ($I_{REF}$) can result in an inefficient design.

Figure 3:
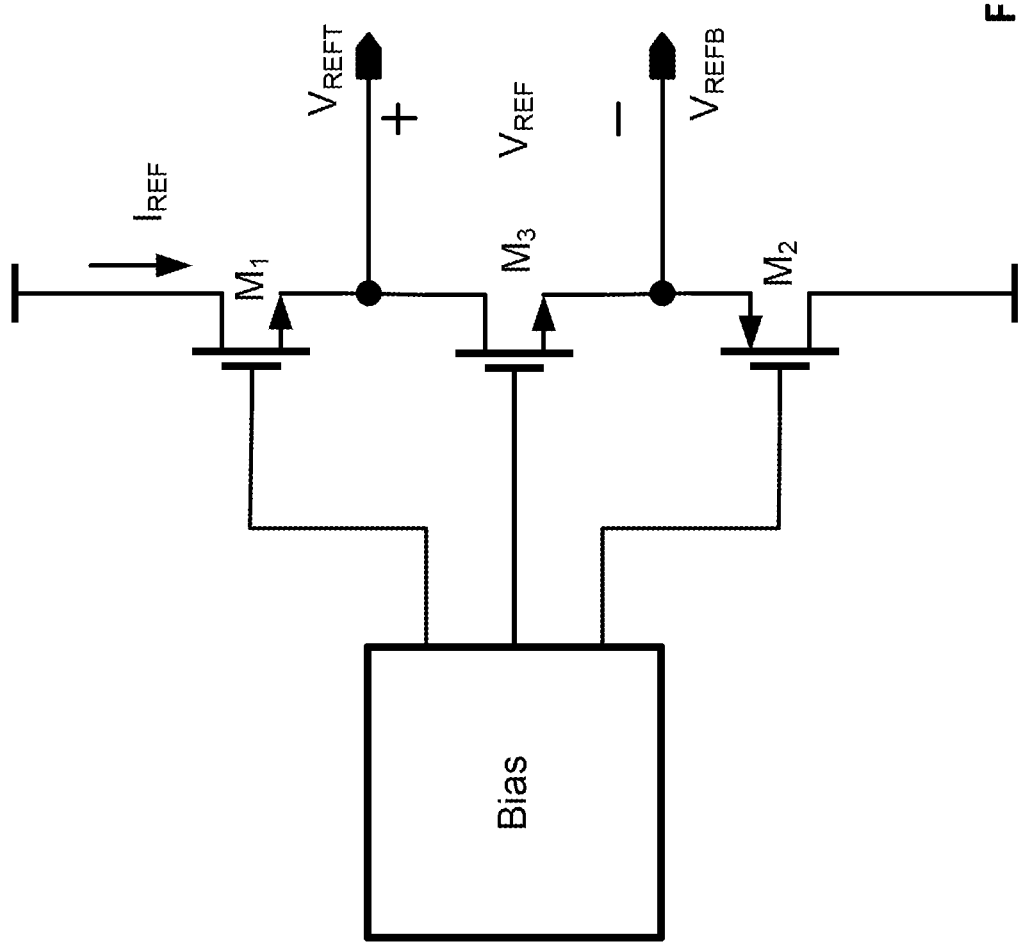
FIG. 3 is a schematic illustrating another implementation of a reference buffer using an n-channel metal-oxide-semiconductor field-effect (NMOS) transistor.

In another example, the pass device can be implemented using an n-channel metal-oxide-semiconductor field-effect (NMOS) transistor in saturation. FIG. 3 is a schematic illustrating another implementation of a reference buffer using an n-channel metal-oxide-semiconductor field-effect (NMOS) transistor (shown as $M_3$ in the FIGURE). However, this implementation using the NMOS transistor $M_3$ is not desirable because the impedance seen at the top reference voltage $V_{REFT}$ and the bottom reference voltage $V_{REFB}$ are not symmetric, i.e., the pass device does not exhibit bidirectional low impedance.

Figure 4:
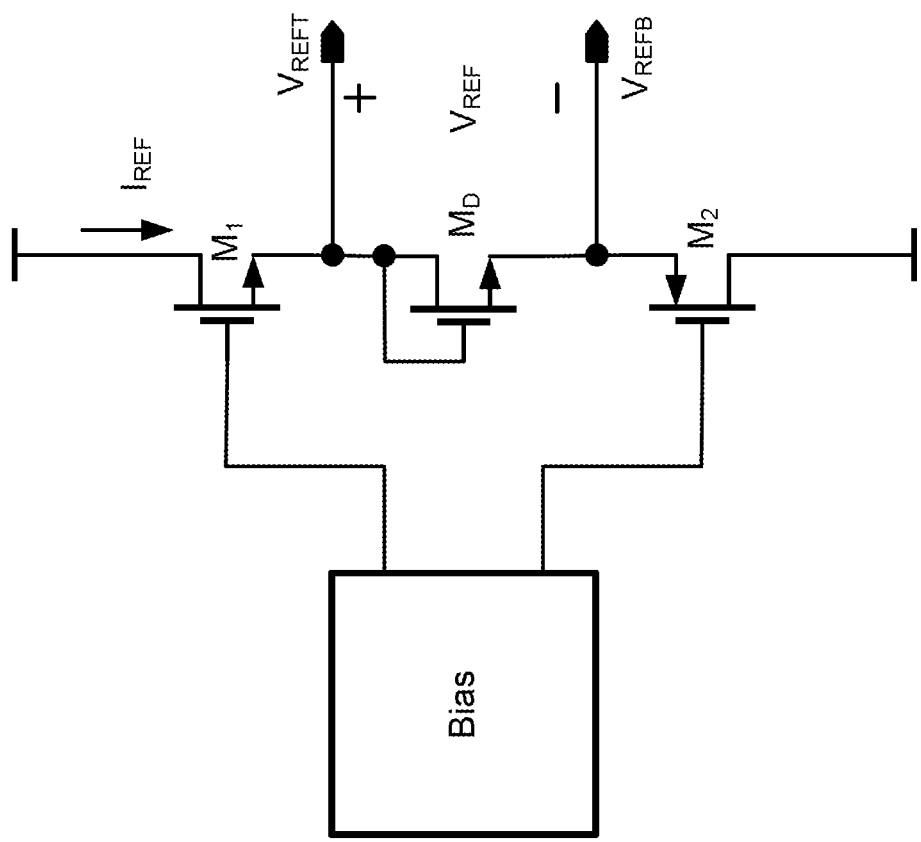
FIG. 4 is a schematic illustrating another implementation of a reference buffer using a single diode-connected n-channel metal-oxide-semiconductor field-effect (NMOS) transistor.

In yet another example, the pass device can be implemented using a diode-connected NMOS transistor. FIG. 4 is a schematic illustrating another implementation of a reference buffer using a single diode-connected n-channel metal-oxide-semiconductor field-effect (NMOS) transistor (shown as $M_D$ in the FIGURE). It has been shown that faster settling and lower power consumption can be achieved if the pass device is implemented as a diode connected MOS device. However, such a design is not without limitations.

Figure 5:
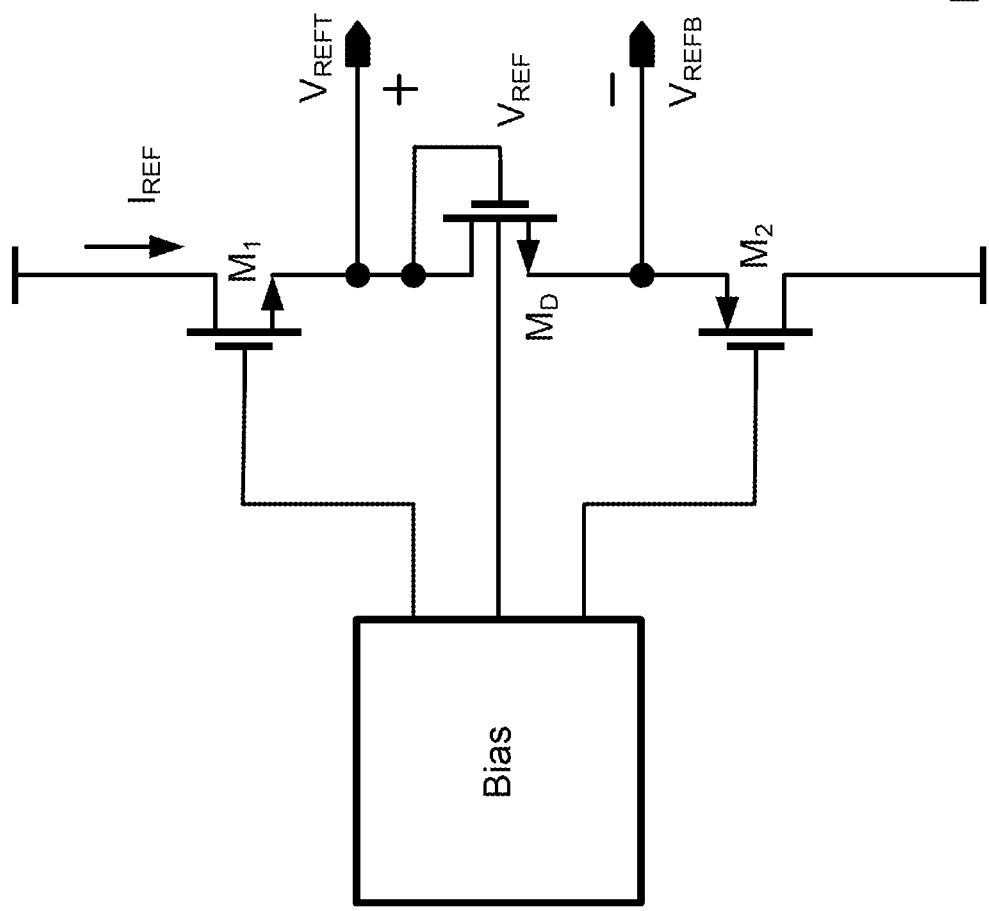
FIG. 5 is a schematic illustrating another implementation of a reference buffer using a single diode-connected n-channel metal-oxide semiconductor field-effect (NMOS) transistor where the back-gate voltage is controlled.

Trimming the reference voltage, i.e., the full-scale voltage ($V_{REFT}$-$V_{REFB}$), is an important feature in ADCs because the signal-to-noise ratio (SNR) can be traded with spurious-free dynamic range (SFDR) depending on the application in which the ADC is used. FIG. 5 is a schematic illustrating another implementation of a reference buffer using a single diode-connected n-channel metal-oxide semiconductor field-effect (NMOS) transistor $M_D$ where the back-gate voltage is controlled (by a bias voltage). It has been demonstrated that controlling the back-gate voltage of the diode-connected transistor can trim the full-scale voltage. However, the achievable trim range is very limited. Furthermore, in such a configuration, the trim range is a function of the strength of the body effect, which is especially problematic in fine geometry (deep submicron) processes because of the weak body effect in these processes.

An Improved Reference Buffer Employing a Switching Mechanism Using a Controller

To address some of these issues, a switching mechanism can be used to switch a various types of metal-oxide semiconductor field effect (MOS) devices/transistors in and out to trim the reference voltage over a wide reference voltage trim range. By having the switches not in the signal paths, the speed is not affected. Even though the number of devices are increased, submicron processes devices are so small, the effect of the increase in area does not significantly affect the overall quality of the ADC. The end result is a fast and efficient reference buffer with wide trim range. Among many other things, it can be used as an internal reference buffer for high speed ADCs, such as a pipeline ADC. The reference voltage can be changed from 600 mV to 1+V in a 65 nm process. The switching scheme used in the described reference buffer facilitates wide trim range without compromising speed.

The improved reference buffer is a programmable reference buffer, where the reference buffer can be programmable based on the desired reference voltage or desired reference voltage trim range. This is achieved by having a collection of devices as potential devices to be used as the pass device, and the devices can have varying properties to produce the desired reference voltage and/or desired reference voltage trim range.

Figure 6:
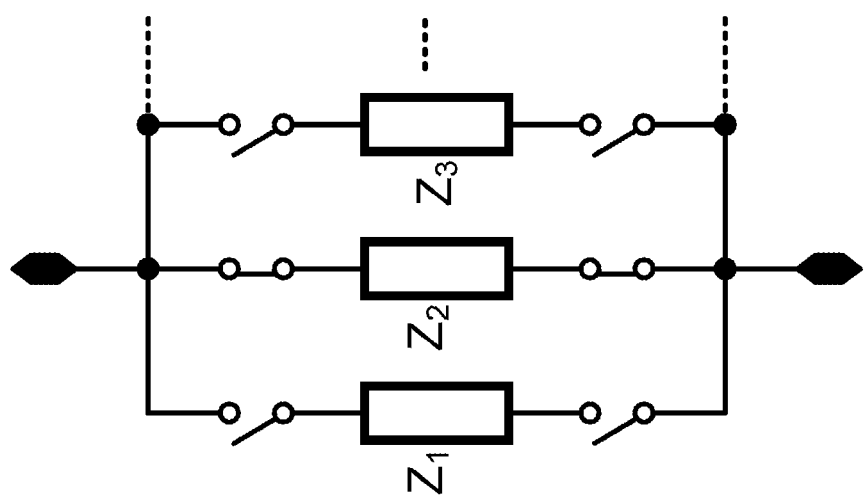
FIG. 6 is a diagram illustrating a switching scheme for providing a pass device in the reference buffer, according to some embodiments of the disclosure.
Figure 6:
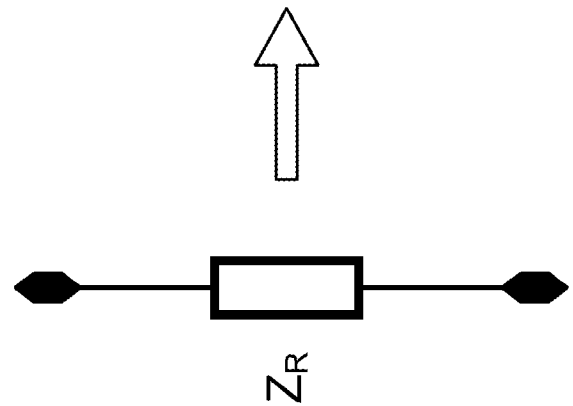

FIG. 6 is a diagram illustrating a switching scheme for providing a pass device in the reference buffer, according to some embodiments of the disclosure. The pass device, rather than having only a single device, now has a plurality of devices, shown as $Z_1$, $Z_2$, $Z_3$, and so on. Depending on the desired reference voltage (trim range) to be provided by the reference buffer, the device implementing $Z_R$ (or being used as part of the pass device $Z_R$) can be switched with another device to trim the full-scale reference voltage. In some cases, a subset of devices can be selected to implement $Z_R$ or be used as part of the pass device $Z_R$.

Because the various types of devices can have different physical properties and characteristics (thus different reference voltage trimming ranges), the overall reference voltage trimming range of the reference buffer is effectively extended over a wide range by having a switching mechanism. For example, if the pass device $Z_R$ is implemented as a diode connected NMOS transistor, a proper size or type (NMOS, PMOS, threshold voltage, etc.) device can be switched to extend the trim range of the full-scale voltage. Broadly speaking, the switching mechanism allows a variety of devices with different properties to be switched in (i.e., used as the pass device $Z_R$) to suit a particular reference voltage (trim range) desired. Effectively, the switching mechanism extends the trim range of a reference buffer, where the pass device of the reference buffer includes one or more diode connected MOS transistor.

Note that the switching scheme shown in FIG. 6 is for illustration only (to show how a switching mechanism may operate) because the switching is facilitated with switches in the signal path. A switch in the signal path can slow down the settling behavior of the buffer. Therefore, such a configuration is not desirable. A more practical implementation would utilizes switches which are not in the signal path.

The switching mechanism relies on switching diode-connected transistors (having different properties) in and out. The result is a programmable reference buffer, where reference voltage trimming can be achieved over a wide range of reference voltages. In some embodiments, the programmable reference buffer includes a stacked source follower comprising a first transistor and a second transistor in a common drain configuration, a pass device separating the first transistor and a second transistor, wherein the pass device comprises selectable diode-connected transistors; and a controller having output control signals for selecting one or more of the diode-connected transistors to be used as part of the pass device based on a reference voltage to be provided at a first terminal and a second terminal of the pass device. The controller is explained in further detail in relation to FIG. 7.

The diode-connected transistors may include one or more of the following: diode-connected n-channel metal-oxide-semiconductor field-effect transistor(s) and diode-connected p-channel metal-oxide semiconductor field-effect transistor(s). Different types of diode-connected transistors can be used to provide the low impedance pass device, depending on the application.

The first transistor may be an n-channel metal-oxide-semiconductor field-effect transistor, and the second transistor may be a p-channel metal-oxide-semiconductor field-effect transistor. The first terminal of the pass device is connected to the source of the first transistor and the second terminal of the pass device is connected to the source of the second transistor.

Figure 7:
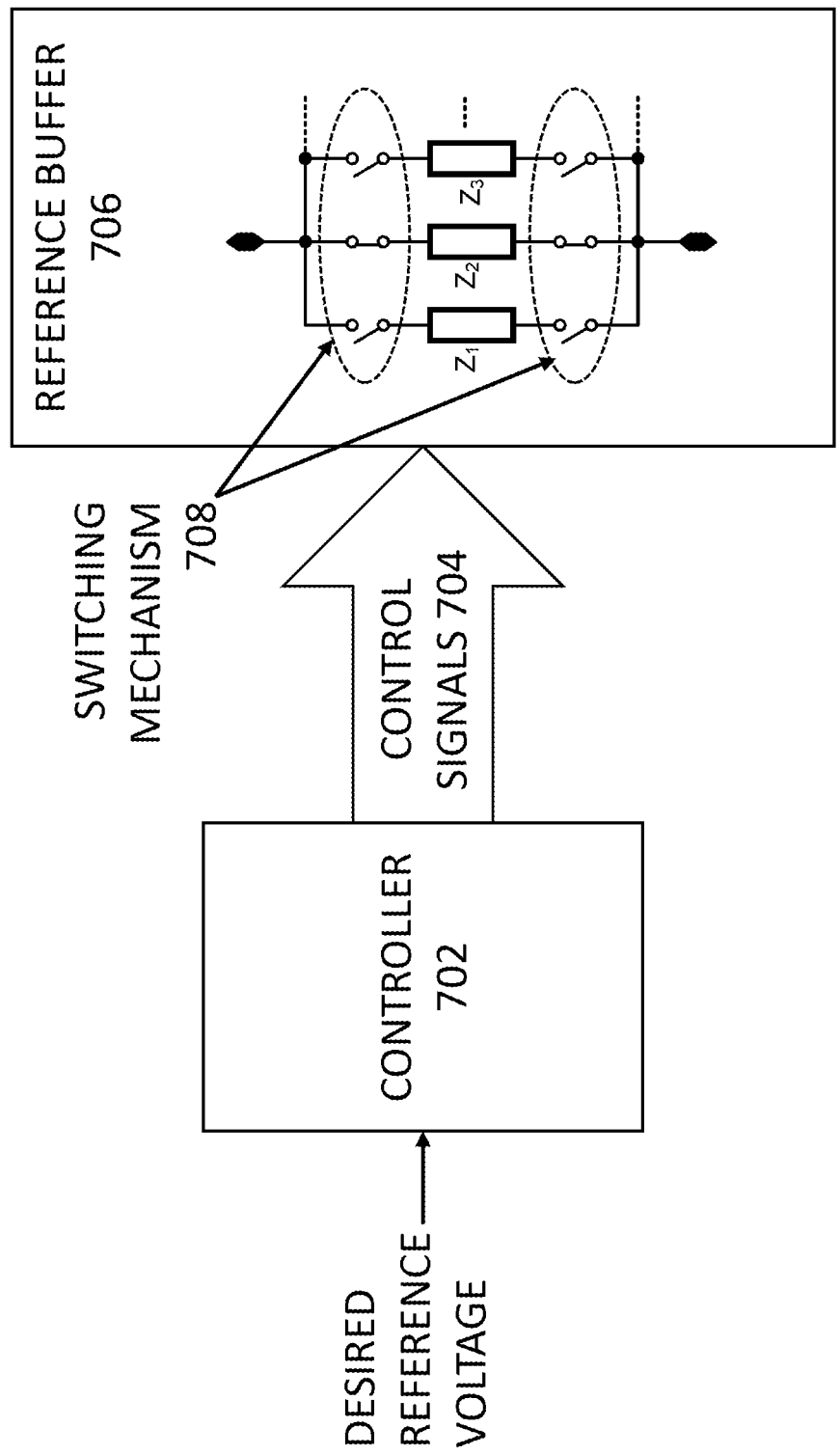
FIG. 7 is a schematic illustrating an implementation for providing a pass device in the reference buffer, according to some embodiments of the disclosure.

FIG. 7 is a schematic illustrating an implementation for providing a pass device in the reference buffer, according to some embodiments of the disclosure. A controller 702 is provided which may take a desired reference voltage (i.e., a reference voltage to be provided at the first terminal and the second terminal of the pass device) and/or a desired reference voltage trim range as input, and outputs control signals 704 for selecting one or more of the diode-connected transistors to be used as part of the pass device in reference buffer 706. The selection of the one or more diode-connected transistors can be made via the switching mechanism 708 (implemented using schemes shown in FIGS. 8 and 9).

Controller Provides Control Signals and Switches are not in the Signal Path

The switching can be configured such that there are no switches in the signal path to ensure the speed of the pass device is not compromised. In other words, the switches are not in the signal path of the diode-connected transistors of the pass device. Using a controller (such as controller 702 of FIG. 7), the control signals generated by the controller can be used to control switches for selecting the one or more of the diode-connected transistors to be used as part of the pass device.

Figure 8:
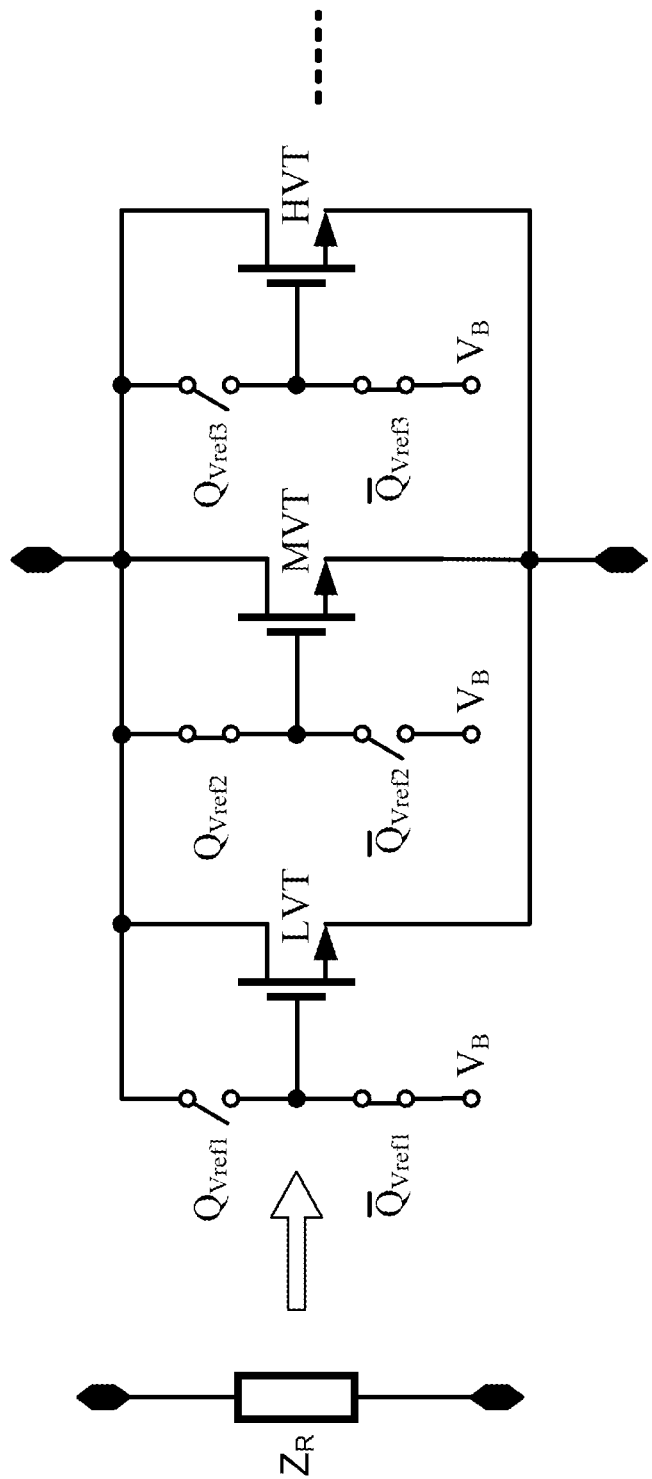
FIG. 8 is a schematic illustrating an implementation for providing a pass device in the reference buffer, according to some embodiments of the disclosure.

Such a switching scheme is shown in FIG. 8, which is a schematic illustrating an implementation for providing a pass device in the reference buffer, according to some embodiments of the disclosure. In this configuration, the reference voltage ($V_{REF}=V_{REFT}-V_{REFB}$) is equal to the gate-to-source voltage, $V_{GS}$, of the diode-connected device selected to be used as the pass device. Any one of the diode-connected device can be selected to be used as the pass device via the control signals $Q_{Vref1}$, $\overline{Q}_{Vref1}$, $Q_{Vref2}$, $\overline{Q}_{Vref2}$, $Q_{Vref3}$, $\overline{Q}_{Vref3}$, etc. The control signals turns the appropriate switches on or off to provide the desired pass device. For each diode-connected device, one switch can be provided between the drain and the gate of the diode-connected device, and another switch can be provided between a bias voltage $V_B$ and the gate of the diode-connected device. One or more of the diode-connected transistors not selected to be used as part of the pass device are switched to operate in a cut-off region. The one or more diode-connected transistors not selected to be used are switched using pull-down switches between a bias voltage and the gates of the one or more of the diode-connected transistors not selected to be used.

Providing Types of Devices Having Different Threshold Voltages

The improved reference buffer has a collection of devices/transistors as potential devices which can be used as part of the pass device. Preferably, these transistors or groups of transistors can have different properties to provide a variety of devices to select from. The transistors can have different threshold voltages. By having different threshold voltages, a wide trim range can be achieved.

In some embodiments, the one or more of the diode-connected transistors as selectable devices in pass device of the reference buffer can comprise diode-connected transistors having different threshold voltages for providing different reference voltage trim ranges. This can be achieved simply by including diode-connected transistors having different flavors to provide the different threshold voltages.

Using the MOSFET square law model for a MOS device, the $V_{GS}$ of the pass device (i.e., $V_{REF}$) is dependent on the threshold voltage of the device. $V_{GS}$ (i.e., $V_{REF}$) is given by:

$$V_{REF} = V_{GS} = V_T + \sqrt{\frac{2I_{REF}}{\mu C_{OX}\frac{W}{L}}}$$

Where $V_T$ is the threshold voltage of the diode-connected transistor, $\mu$ and $C_{OX}$ are process parameters, and W (width) and L (length) are design parameters.

Based on the model, the reference voltage $V_{REF}$ can be changed by using diode connected devices with different threshold voltages ($V_T$'s) as shown by the following equations. In other words, the desired reference voltage $V_{REF}$ (trim range) can be achieved by selecting the MOS device with the proper threshold voltage and parameters as the pass device.

$$V_{REF-low} = V_{T-LVT} + \sqrt{\frac{2I_{REF}}{\left|\mu C_{OX}\frac{W}{L}\right|_{LVT}}}$$

$$V_{REF-mid} = V_{T-MVT} + \sqrt{\frac{2I_{REF}}{\left|\mu C_{OX}\frac{W}{L}\right|_{MVT}}}$$

$$V_{REF-high} = V_{T-HVT} + \sqrt{\frac{2I_{REF}}{\left|\mu C_{OX}\frac{W}{L}\right|_{HVT}}}$$

In the example shown in FIG. 8, three types of devices are provided, i.e., a transistor with low threshold voltage (LVT), a transistor with medium threshold voltage (MVT), and a transistor with high threshold voltage (HVT). Each of these transistors have its own set of threshold voltages and parameters. Using the control signals, any one of these devices can be selected (switched in or activated). In one example, for a given desired reference voltage trim range, the medium threshold voltage transistor can be switched in. If the given desired reference voltage trim range is smaller, then low threshold voltage transistor can be selected. Effectively, the reference voltage trim range is changed as allowed by the varying types of diode-connected devices available to be used as part of the pass device.

Naturally, other number of types of devices can be selected in this manner. Within the context of the disclosure, different reference voltage trim ranges are defined as different ranges of reference voltage which corresponding diode-connected transistors are configured to maintain at the first terminal and the second terminal of the pass device for a substantially the same bias current ($I_{REF}$) through the pass device.

Providing Different Threshold Voltages by Adjusting the Width

In some cases, the diode-connected transistors associated with different threshold voltages are at least in part provided by diode-connected transistors having different widths. Relying on the $V_T$'s of different type of devices to set the reference voltage may result in coarse variations in the reference voltage if the bias current ($I_{REF}$) is to be kept relatively constant. The width (W) of the diode connected device can be changed to achieve finer reference voltage trim while maintaining $I_{REF}$ relatively constant, as illustrated by the following equation.

$$V_{REFi} = V_T + \sqrt{\frac{2I_{REF}}{\mu C_{OX} \frac{Wi}{L}}}$$

The W of the diode connected device can be changed by switching a portion of the diode connected device in or out. A diode-connected device can include a plurality of smaller diode-connected transistors in parallel to provide the width W of the aggregate diode-connected device. Accordingly, the width of the diode-connected device can be adjusted based on the number of the smaller diode-connected devices being switched in.

Figure 9:
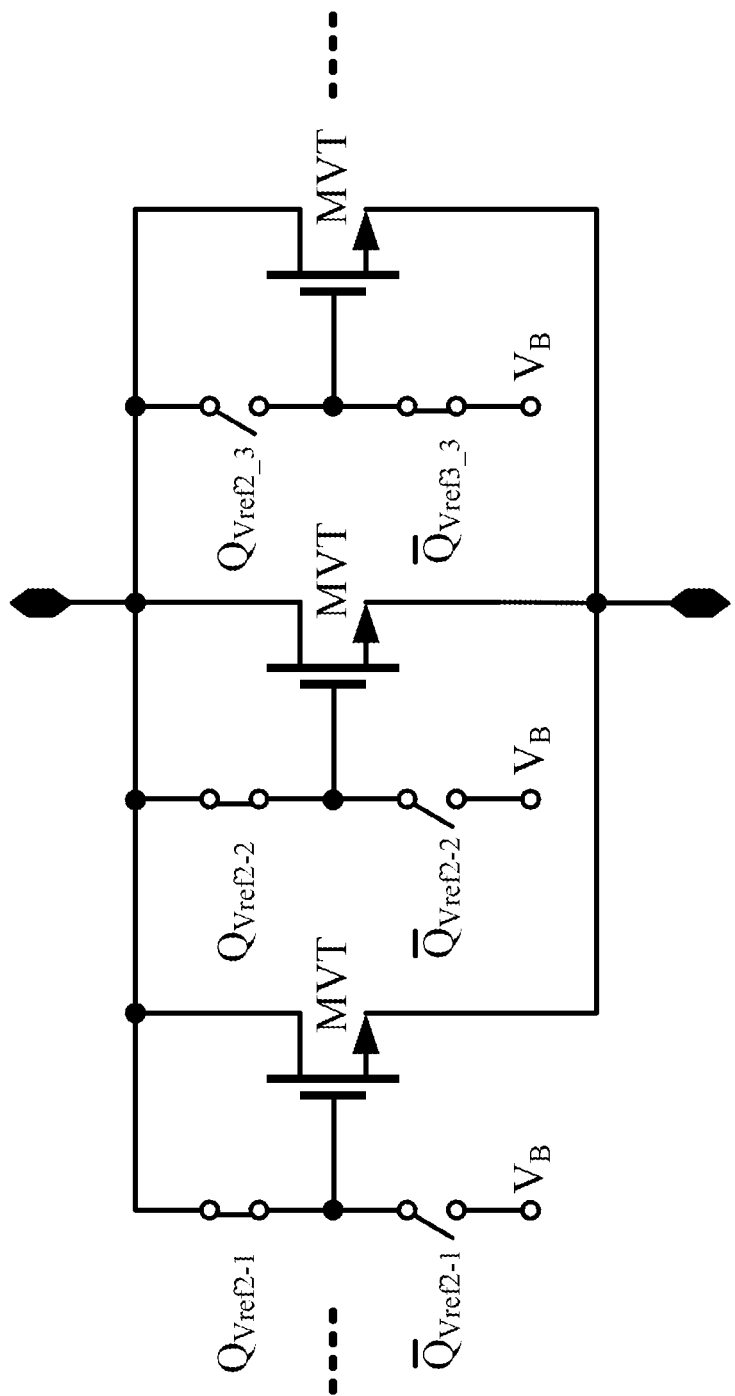
FIG. 9 is a schematic illustrating an implementation for providing a pass device in the reference buffer, according to some embodiments of the disclosure.

FIG. 9 is a schematic illustrating an implementation for providing a pass device in the reference buffer, according to some embodiments of the disclosure. As shown in FIG. 9, the medium threshold voltage diode-connected transistor can have smaller diode-connected transistors arranged in parallel. Switches can be provided between the drain and the gate of a smaller diode-connected transistor and between the gate of the smaller diode-connected transistor and a bias voltage $V_B$. The FIGURE shows at least three diode-connected transistors. To change the width of the diode-connected transistor, one or more of the smaller diode-connected transistors (each labeled as MVT) can be switched in (i.e., the one or more of smaller diode-connected transistors can be selected as a group). In other words, the groups of diode connected transistor(s) associated with different threshold voltages selectable by the controller can include one or more groups of one or more diode-connected transistors in parallel. In some cases, the one or more diode-connected transistors in parallel have substantially the same width.

Selecting a Group of Diode-Connected Devices Rather than Just One

In some cases, the controller selects a single one of the diode-connected transistor to be used as the pass device. In some other cases, the diode-connected transistors comprises groups of diode-connected transistor(s) associated with different reference voltage trim ranges (or different combinations of the diode-connected transistor(s) associated with different reference voltage trim ranges). Rather than selecting a single transistor, groups of diode-connected transistors can be selected (using proper control signals from the controller) to provide finer grain control over the threshold voltage and to provide a wider variety of types of diode-connected devices available to be used as the pass device. Selecting one or more of the plurality of diode elements based on the reference voltage to be provided may include determining in which of the different reference voltage trim ranges the reference voltage (trim range) to be provided falls and selecting the group of diode-connected transistor(s) corresponding to the determined reference voltage trim range.

Such a selection mechanism can be beneficial, e.g., if the transistor comprises a plurality of transistors in parallel (which is often the case when a transistor is implemented in a wafer design), and switching a subset of the transistors in parallel in/out can change the reference voltage trim range. Effectively, the reference voltage trim range is adjusted by adjusting the width (W) of the diode connected device by switching a portion of the diode connected device in or out.

Other Ways to Provide Diode-Connected Devices Having Different Threshold Voltages Besides adjusting the width of the diode-connected transistor or using different flavors of these MOS devices, it is envisioned that the different threshold voltages can be achieved in other ways. The diode-connected transistors with different threshold voltages can be in parts in part provided by diode-connected transistors whose threshold voltages are affected by one or more of the following: body effect, channel length, stress, well proximity effect, and gate bias. This allows even a wider range of devices that can be used, and in some cases, provide finer control over the threshold voltages of these diode-connected devices.

Example Application: An Improved Pipeline ADC

An analog-to-digital converter (ADC) leveraging the improved reference buffer may include an input for receiving an analog signal, an output for outputting a digital signal, a programmable reference buffer for providing a range of reference voltages, and one or more comparators for comparing the analog signal or one or more residuals of the analog signal against the reference voltage provided by the programmable reference buffer to generate the digital signal. The programmable reference buffer can be any embodiment of the programmable reference buffer described herein.

In some cases, the ADC is a pipeline ADC comprising a plurality of pipelined stages for comparing the analog signal or one or more residuals of the analog signal against one or more reference voltages provided by the programmable reference buffer. In some other cases, the ADC is a successive approximation register ADC configured to successively compare the analog signal or one or more residuals/derivations of the analog signal against one or more reference voltages provided by the programmable reference buffer. In some other cases, the ADC is a converter which utilizes one or more reference voltages provided by the programmable reference buffer to convert an input analog signal.

An Improved Floating Voltage Source as a Battery

Besides being used in an ADC, the programmable reference buffer can also be used as a floating voltage source as a battery having a positive terminal and a negative terminal. The voltage source comprises a stacked source follower comprising a first transistor and a second transistor in a common drain configuration, a pass device separating the first transistor and a second transistor, wherein the pass device comprises selectable diode-connected transistors, and a controller having output control signals for selecting one or more of the diode-connected transistors to be used as part of the pass device based on a voltage to be provided at a first terminal and a second terminal of the pass device. The first terminal of the pass device is the positive terminal of the battery, and the second terminal of the pass device is the negative terminal of the battery. Variations on the pass device as described herein are also envisioned for the floating voltage source.

Variations and Implementations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve reference buffers. These integrated circuits can be used in applications involving data converters and signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to providing a reference buffer with a wide trim range illustrate only some of the possible switching functions that may be executed by, or within, systems illustrated in FIGS. 6-9. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A programmable reference buffer comprising:
a stacked source follower comprising a first transistor and a second transistor in a common drain configuration;
a pass device separating the first transistor and a second transistor, wherein the pass device comprises selectable diode-connected transistors and switches corresponding to the selectable diode-connected transistors, wherein each switch is connected between a gate of a corresponding selectable diode-connected transistor and a drain of the corresponding selectable diode-connected transistor; and
a controller having output control signals for controlling the switches to select one or more ones of the selectable diode-connected transistors to be used as part of the pass device based on a reference voltage to be provided at a first terminal and a second terminal of the pass device.

2. The programmable reference buffer of claim 1, wherein the one or more ones of the selectable diode-connected transistors comprises selectable diode-connected transistors having different threshold voltages for providing different reference voltage trim ranges.

3. The programmable reference buffer of claim 2, wherein the selectable diode-connected transistors associated with different threshold voltages are at least in part provided by selectable diode-connected transistors having different widths.

4. The programmable reference buffer of claim 3, wherein different reference voltage trim ranges comprises different ranges of reference voltage which corresponding selectable diode-connected transistors are configured to maintain at the first terminal and the second terminal of the pass device for substantially the same bias current through the pass device.

5. The programmable reference buffer of claim 2, wherein the selectable diode-connected transistors with different threshold voltages are in part provided by selectable diode-connected transistors whose threshold voltages are affected by one or more of the following: body effect, channel length, stress, well proximity effect, and gate bias.

6. The programmable reference buffer of claim 1, wherein:
the selectable diode-connected transistors comprises selectable groups of diode-connected transistor(s) associated with different reference voltage trim ranges; and
the controller selects one or more ones of the selectable diode-connected transistors based on the reference voltage to be provided by determining in which of the different reference voltage trim ranges the reference voltage to be provided falls and outputting control signals to select a selectable group of diode-connected transistor(s) corresponding to the determined reference voltage trim range.

7. The programmable reference buffer of claim 6, wherein the selectable groups of diode connected transistor(s) associated with different threshold voltages comprises groups of one or more diode-connected transistors in parallel.

8. The programmable reference buffer of claim 7, wherein the one or more selectable diode-connected transistors in parallel have substantially the same width.

9. The programmable reference buffer of claim 7, wherein the switches corresponding to the selectable diode-connected transistors are not in the signal path of the selectable diode-connected transistors.

10. The programmable reference buffer of claim 1, wherein:
the control signals from the controller closes one or more ones of pull down switches corresponding to selectable diode-connected transistors to operate one or more ones of the selectable diode-connected transistors not selected to be used as part of the pass device in a cut-off region.

11. The programmable reference buffer of claim 10, wherein each one of the pull down switches is provided between a gate of a corresponding selectable diode-connected transistor and a bias voltage.

12. The programmable reference buffer of claim 1, wherein the selectable diode-connected transistors comprises one or more of the following: selectable diode-connected n-channel metal-oxide-semiconductor field-effect transistor(s) and selectable diode-connected p-channel metal-oxide semiconductor field-effect transistor(s).

13. The programmable reference buffer of claim 1, wherein the first transistor is an n-channel metal-oxide-semiconductor field-effect transistor and the second transistor is a p-channel metal-oxide-semiconductor field-effect transistor.

14. The programmable reference buffer of claim 1, wherein
the first terminal of the pass device is connected to the source of the first transistor; and
the second terminal of the pass device is connected to the source of the second transistor.

15. A floating voltage source as a battery having a positive terminal and a negative terminal, the voltage source comprising:
a stacked source follower comprising a first transistor and a second transistor in a common drain configuration;
a pass device separating the first transistor and a second transistor, wherein the pass device comprises selectable diode-connected transistors and switches for selecting corresponding selectable diode-connected transistors, wherein each one of the switches is connected between a gate of a corresponding selectable diode-connected transistor and a drain of the corresponding selectable diode-connected transistor; and
a controller having output control signals for closing one or more ones of the switches to select one or more corresponding ones of the selectable diode-connected transistors to be used as part of the pass device based on a voltage to be provided at a first terminal and a second terminal of the pass device;
wherein the first terminal of the pass device is the positive terminal of the battery, and the second terminal of the pass device is the negative terminal of the battery.

16. A method for providing a range of reference voltages, the method comprising:
outputting control signals, by a controller, based on a reference voltage to be provided by a pass device, wherein the pass device comprises selectable diode-connected transistors and switches corresponding to selectable diode-connected transistors, each one of the switches is connected between a gate of a corresponding selectable transistor and a drain of the corresponding selectable diode-connected transistor, the pass device separates a first transistor and a second transistor, and the first transistor and the second transistor make up a stack source follower in a common drain configuration;
closing, using the control signals, one or more ones of the switches, to select one or more corresponding ones of the selectable diode-connected transistors of the pass device to be used as part of the pass device; and
outputting, by the pass device, the reference voltage at a first terminal and a second terminal of the pass device.

17. The method of claim 16, wherein:
the selectable diode-connected transistors comprises selectable groups of diode-connected transistor(s) associated with different reference voltage trim ranges; and
the method further comprises determining in which of the different reference voltage trim ranges the reference voltage to be provided falls; and
closing the one or more ones switches selects a selectable group of diode-connected transistor(s) corresponding to the determined reference voltage trim range to be used as part of the pass device.

18. The method of claim 16, wherein:
the switches are not in the signal path of the selectable diode-connected transistors.

19. The method of claim 16, further comprising:
outputting further control signals to operate one or more ones of the selectable diode-connected transistors not selected to be used as part of the pass device in a cut-off region.

20. The method of claim 16, further comprising:
closing, using the control signals, one or more pull down switches to connect gate(s) of the one or more ones selectable diode-connected transistor not selected to be used as part of the pass device to a bias voltage.

* * * * *